United States Patent [19]

Kouta et al.

[11] Patent Number: 5,454,345
[45] Date of Patent: Oct. 3, 1995

[54] METHOD OF GROWING SINGLE CRYSTAL OF β-BARIUM BORATE

[75] Inventors: Hikaru Kouta; Shoko Manako, both of Tokyo, Japan

[73] Assignee: NEC Corporation, Tokyo, Japan

[21] Appl. No.: 77,767

[22] Filed: Jun. 18, 1993

[30] Foreign Application Priority Data

Jun. 18, 1992 [JP] Japan .................................. 4-159072
Dec. 14, 1992 [JP] Japan .................................. 4-332640

[51] Int. Cl.$^6$ ................................................ C30B 29/10
[52] U.S. Cl. .............................. 117/13; 117/35; 117/36; 117/944
[58] Field of Search .......................... 156/617.1, 620.2, 156/620.5, DIG. 86, DIG. 78; 117/13, 35, 36, 944

[56] References Cited

FOREIGN PATENT DOCUMENTS

| | | | |
|---|---|---|---|
| 02172891 | 7/1990 | Japan | 156/DIG. 86 |
| 02172892 | 7/1990 | Japan | 156/DIG. 86 |
| 02279596 | 11/1990 | Japan | 156/620.5 |
| 0354112 | 3/1991 | Japan | 156/620.5 |

OTHER PUBLICATIONS

Kouta et al. "β–BaB$_2$O$_4$ Single Crystal Growth by Czochralski Method", Journal of Crystal Growth, vol. 114 (1991) pp. 676–682.

*Primary Examiner*—Robert Kunemund
*Attorney, Agent, or Firm*—Sughrue, Mion, Zinn, Macpeak & Seas

[57] ABSTRACT

In growing a single crystal of β-BaB$_2$O$_4$ from a melt of BaB$_2$O$_4$ by the Czochralski method, crushed single crystal particles of either β-BaB$_2$O$_4$ or α-BaB$_2$O$_4$ are used as the starting material of the melt. The primary advantage of using the crushed single crystal particles resides in that transformation of a polycrystal initially nucleated on a platinum rod, which is brought into contact with the melt in place of a seed crystal, to single crystal can be accomplished in a greatly shortened time. In consequnce, high quality single crystals are obtained at good yield.

2 Claims, No Drawings

METHOD OF GROWING SINGLE CRYSTAL OF β-BARIUM BORATE

BACKGROUND OF THE INVENTION

This invention relates to a method of growing a single crystal of β-barium borate, β-BaB$_2$O$_4$, by a Czochralski technique.

It is known to grow a high purity β-BaB$_2$O$_4$ single crystal by the Czochralski method from a BaB$_2$O$_4$ melt. The starting material for the melt is either a powder of β phase BaB$_2$O$_4$ (Journal of Crystal Growth, Vol. 106 (1990), 728–731) or sintered grains of β phase BaB$_2$O$_4$ powder (Journal of Crystal Growth, Vol. 114(1991), 676–682).

However, practical applications of the known growth methods encounter several problems. When the starting material of the melt is a β phase powder, which may be sintered, it is convenient to use a platinum rod instead of a seed crystal. At the contact of the platinum rod with the melt a crystalline material nucleates on the platinum rod, but the nucleated material is a polycrystal of β-BaB$_2$O$_4$. To cause transformation of the nucleated polycrystal to a single crystal there is the need of first adjusting the diameter of the polycrystal to about 1.5 mm and then growing the crystal to a length of 5 to 10 mm while keeping the diameter of about 1.5 mm. This operation takes a considerably long time and requires intricate techniques, and often the operation fails by breaking of the growing crystal from the melt or by accidental transition of the β phase to the α phase. Besides, the yield of acceptable β-BaB$_2$O$_4$ single crystals is relatively low because in many cases grain boundaries exist in the grown β-BaB$_2$O$_4$ single crystals.

SUMMARY OF THE INVENTION

It is an object of the present invention to provide an improved method for efficiently growing a high quality single crystal of β-BaB$_2$O$_4$ from a melt of BaB$_2$O$_4$ by a Czochralski technique.

According to the invention the object is accomplished by using crushed single crystal particles of either β-BaB$_2$O$_4$ or α-BaB$_2$O$_4$ as the starting material of the melt.

When crushed single crystal particles of β-BaB$_2$O$_4$ are used as the starting material, the melt partly retains the BaB$_2$O$_4$ structure even after the lapse of a considerable time from the moment of melting. Therefore, a β-BaB$_2$O$_4$ polycrystal which is very good in crystal orientation nucleates on a platinum rod brought into contact with the melt, and by virtue of the good orientation the transformation of the polycrystal to single crystal can be accomplished in a fairly short time. Furthermore, the probability of existence of subgrain boundaries in the fully grown crystal becomes very low, and hence high quality β-BaB$_2$O$_4$ single crystals can be otained at good yield.

It may seem queer to use β-BaB$_2$O$_4$ single crystal particles for growing another single crystal of β-BaB$_2$O$_4$. However, in industrial practice it is inevitable that some portions of grown single crystals have defects such as cracks or subgrain boundaries or become useless. In the present invention it is possible to utilize such defective or useless single crystals of β-BaB$_2$O$_4$ by crushing into suitable particles.

When crushed single crystal particles of α-BaB$_2$O$_4$ are used, the melt also partly retains the BaB$_2$O$_4$ structure for a considerably long time. Therefore, the transformation of the aforementioned polycrystal to single crystal can be accomplished in a short time, and high quality β phase single crystals can be obtained at good yield. It is very convenient to use α phase single crystals since α-BaB$_2$O$_4$ single cyrstals of fairly large size can easily be grown at good yield by a conventional Czochralski method.

DESCRIPTION OF THE PREFERRED EMBODIMENTS

Example 1

As the starting material for the growth of a single crystal of β-BaB$_2$O$_4$ by the Czochralski method, crushed particles of defective or useless single crystals of β-BaB$_2$O$_4$ were used. The crushed single crystals were originally grown by the Czochralski method using a β-BaB$_2$O$_4$ powder as the starting material.

Using a conventional RF furnace, the crushed particles of the β phase single crystals were heated in a platinum crucible. Initially the temperature was raised at a rate of about 200° C./min until the temperature neared the melting point of β-BaB$_2$O$_4$. Then the heating rate was slowed down to 10° C./min, and heating was continued in order to completely melt the crystal particles with care to avoid overheating. At the end of this melting operation the temperature in the center of the melt was about 1100° C.

Immediately after the above melting operation, a vertically held platinum rod having a diameter of 1.5 mm was brought into contact with the melt to initiate crystallization of a polycrystal on the tip of the platinum rod. Then the temperature of the melt was carefully lowered by about 10°–20° C. in order to enlarge the diameter of the polycrystal on the platinum rod. After that the platinum rod was pulled up at a rate of 3 mm/hr. When the pull-up reached about 7 mm the polycrystal turned into a single crystal having a diameter of 3 mm. In this operation 3–4 hr elapsed from the beginning of precipitation of the polycrystal on the platinum rod until the change of the polycrystal to the single crystal. After that the pulling operation was continued while the temperature of the melt was lowered in order to increase the diameter of the single crystal.

The product of the above crystal growth process was a crack-free β-BaB$_2$O$_4$ single crystal 12 mm in diameter and 50 mm in length. This single crystal was cut and polished to provide optical surfaces for surveyllance with a striameter. No striae were detected, and the single crystal proved to be an optically high quality crystal.

Example 2

As the starting material, crushed single crystal particles of α-BaB$_2$O$_4$ were used. The single crystals were originally grown by the Czochralski method using a BaB$_2$O$_4$ powder as the starting material.

Melting of the α-BaB$_2$O$_4$ single crystal particles in a platinum crucible and growth of a crystal from the melt were carried out in the same manner as in Example 1. In this example too a platinum rod having a diameter of 1.5 mm was used as a cold finger for seeding.

The product of this example was a crack-free β-BaB$_2$O$_4$ single crystal 10 mm in diameter and 30 mm in length. This single crystal proved to be an optically high quality crystal free of striae. In this example, it took 3–4 hr to accomplish transformation of the initially nucleated polycrystal to single crystal.

Comparative Examples

As the starting materials for the growth of β-BaB$_2$O$_4$ single crystals by the Czochralski method, (i) a BaB$_2$O$_4$ powder, (ii) a powder mixture of B$_2$O$_3$ and BaO in the proportions equivalent to the composition of BaB$_2$O$_4$ and (iii) a powder mixture of H$_3$BO$_3$ and BaCO$_3$ in the proportions equivalent to the composition of BaB$_2$O$_4$ were alternately used. In every case the crystal growth process was generally similar to that in Example 1.

In any of these comparative examples the polycrystal initially precipitated on the platinum wire was inferior in crystal orientation, and it took more than 10 hr to change the polycrystal to single crystal. In every case the obtained β-BaB$_2$O$_4$ single crystal had cracks and subgrain boundaries.

What is claimed is:

1. A method of growing a single crystal of β-barium borate from a melt of BaB$_2$O$_4$ by a Czochralski technique, characterized in that crushed single crystal particles of α-barium borate are used as the starting material of the melt.

2. A method according to claim 1, comprising the steps of bringing a platinum rod into contact with said melt to thereby precipitate a polycrystal of β-barium borate on the platinum rod, transforming the polycrystal to a single crystal and thereafter growing the single crystal.

* * * * *